United States Patent
Sugawa (10) Patent No.: US 12,278,131 B2
(45) Date of Patent: Apr. 15, 2025

(54) STAGE AND PLASMA PROCESSING APPARATUS

(71) Applicant: Tokyo Electron Limited, Tokyo (JP)

(72) Inventor: Naoki Sugawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 69 days.

(21) Appl. No.: 17/143,399

(22) Filed: Jan. 7, 2021

(65) Prior Publication Data

US 2021/0210369 A1   Jul. 8, 2021

(30) Foreign Application Priority Data

Jan. 8, 2020   (JP) ................ 2020-001714

(51) Int. Cl.
| | |
|---|---|
| H01L 21/683 | (2006.01) |
| H01J 37/20 | (2006.01) |
| H01J 37/305 | (2006.01) |
| H01L 21/67 | (2006.01) |

(52) U.S. Cl.
CPC .......... *H01L 21/683* (2013.01); *H01J 37/20* (2013.01); *H01J 37/305* (2013.01); *H01L 21/67069* (2013.01)

(58) Field of Classification Search
None
See application file for complete search history.

(56) References Cited

U.S. PATENT DOCUMENTS

| | | | | |
|---|---|---|---|---|
| 5,636,098 | A * | 6/1997 | Salfelder | H01L 21/6833 361/234 |
| 6,771,482 | B2 * | 8/2004 | Kenney | H01L 21/67126 361/233 |
| 9,520,814 | B2 * | 12/2016 | Hayashi | H02N 13/00 |
| 9,859,142 | B2 * | 1/2018 | Schaefer | H01L 21/6833 |
| 2004/0196613 | A1 * | 10/2004 | Zheng | H01L 21/68735 361/234 |
| 2009/0044751 | A1 * | 2/2009 | Park | H01L 21/68735 118/723 R |
| 2009/0200269 | A1 * | 8/2009 | Kadkhodayan | H01L 21/67069 427/523 |
| 2010/0040768 | A1 * | 2/2010 | Dhindsa | H01J 37/32724 427/248.1 |

(Continued)

FOREIGN PATENT DOCUMENTS

JP   2015515760 A   5/2015

*Primary Examiner* — Parviz Hassanzadeh
*Assistant Examiner* — Tiffany Z Nuckols
(74) *Attorney, Agent, or Firm* — Nath, Goldberg & Meyer; Jerald L. Meyer; Tanya E. Harkins (57) ABSTRACT

A stage includes a first mounting part on which a substrate is mounted, a second mounting part on which an edge ring surrounding a peripheral edge of the substrate is mounted, the second mounting part being lower than the first mounting part, a first bonding layer configured to bond a base to the first mounting part, a second bonding layer configured to bond the base to the second mounting part, and a seal member configured to close a space between the first mounting part and the second mounting part by deformation of the seal member above the first bonding layer and the second bonding layer while contacting with each of the first mounting part and the second mounting part.

13 Claims, 4 Drawing Sheets

(56) References Cited

U.S. PATENT DOCUMENTS

| | | | |
|---|---|---|---|
| 2013/0340942 A1* | 12/2013 | Schaefer | H01J 37/3255 |
| | | | 29/505 |
| 2015/0053348 A1* | 2/2015 | Nagayama | H01J 37/3266 |
| | | | 118/723 R |
| 2016/0240421 A1* | 8/2016 | Chang | F16J 15/106 |
| 2018/0166312 A1* | 6/2018 | Kimball | H01J 37/00 |
| 2020/0152429 A1* | 5/2020 | Sasaki | H01L 21/68735 |
| 2020/0251313 A1* | 8/2020 | Rogers | H01L 21/67069 |
| 2020/0273680 A1* | 8/2020 | Koiwa | H01J 37/32642 |
| 2020/0388471 A1* | 12/2020 | Takebayashi | H01L 21/3065 |

* cited by examiner

STAGE AND PLASMA PROCESSING APPARATUS

CROSS-REFERENCE TO RELATED APPLICATION

This application is based upon and claims the benefit of priority from Japanese Patent Application No. 2020-001714, filed on Jan. 8, 2020, the entire contents of which are incorporated herein by reference.

TECHNICAL FIELD

The present disclosure relates to a stage and a plasma processing apparatus.

BACKGROUND

A plasma processing apparatus includes, for example, a stage having a mounting part on which a substrate to be processed is mounted and a base for supporting the mounting part under the mounting part. In such a stage, for example, the mounting part is made of ceramics and the base is made of metal such as aluminum, in which the mounting part is bonded to the base with a bonding agent. In the plasma processing apparatus, for example, a protective seal or the like is prepared to protect the bonding agent damaged by plasma.

PRIOR ART DOCUMENTS

Patent Documents

Patent Document 1: Japanese laid-open publication No. 2015-515760

SUMMARY

According to one embodiment of the present disclosure, there is provided a stage including a first mounting part on which a substrate is mounted, a second mounting part on which an edge ring surrounding a peripheral edge of the substrate is mounted, the second mounting part being lower than the first mounting part, a first bonding layer configured to bond a base to the first mounting part, a second bonding layer configured to bond the base to the second mounting part, and a seal member configured to close a space between the first mounting part and the second mounting part by deformation of the seal member above the first bonding layer and the second bonding layer while contacting with each of the first mounting part and the second mounting part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, an embodiment of a stage and a plasma processing apparatus disclosed will be described in detail with reference to the drawings. The disclosed technique is not limited by the following embodiment.

In addition to a processing target, an edge ring surrounding a peripheral edge of a substrate is also mounted on a mounting part of the stage. Since the edge ring is thicker than the substrate, it has a structure in which a portion of the mounting part on which the edge ring is mounted is one step lower than a portion on which the substrate is mounted. Such a structure can be realized by, for example, having a structure in which a base and the mounting part of the stage can be divided into a portion on which the substrate is mounted and a portion on which the edge ring is mounted. However, since there are a step and a gap between the divided portions of the base and the mounting part, a layer of a bonding agent between the mounting part and the base (hereinafter, also referred to as a bonding layer) may be exposed at different heights in the respective portions on which the substrate and the edge ring are mounted. In this case, for the bonding layer of a portion on which the substrate is mounted, which is in an upper position in a height direction, a protective member is required to be arranged in a direction of inwardly tightening up the circumference from the outside. An O-ring or the like is used for protection. On the other hand, for the bonding layer of a portion on which the edge ring is mounted, which is in a lower position in the height direction, the protective member is required to be arranged in a direction of outwardly expanding the circumference from the inside, making it difficult to protect it with the O-ring. Therefore, it is expected that a plurality of bonding layers having different heights are protected by one seal member.

[Configuration of Plasma Processing Apparatus 1]

Figure 1:
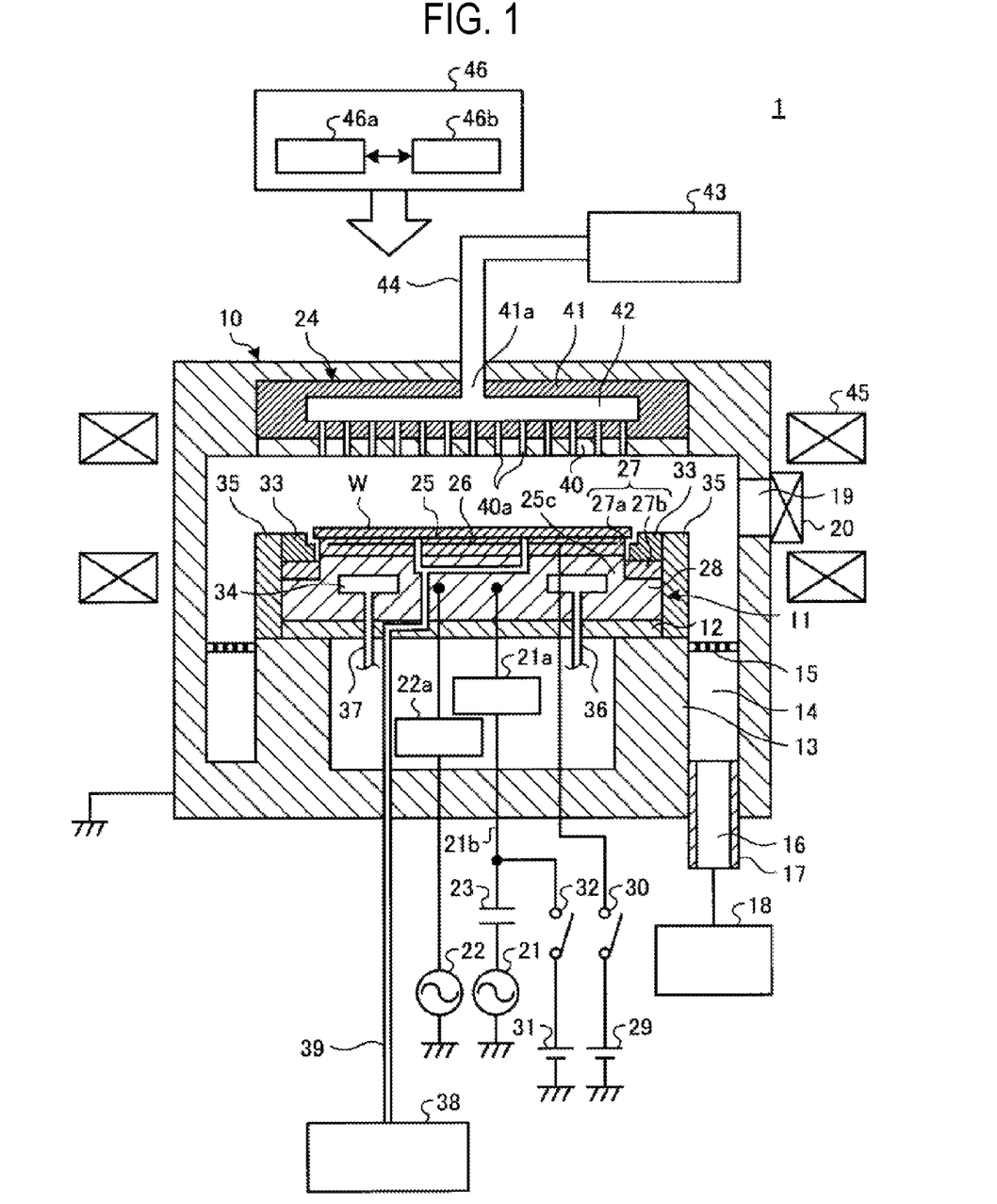
FIG. 1 is a view illustrating an example of a plasma processing apparatus according to an embodiment of the present disclosure.

FIG. 1 is a diagram illustrating an example of a plasma processing apparatus according to an embodiment of the present disclosure. A plasma processing apparatus 1 illustrated in FIG. 1 is, for example, a reactive ion etching (RIE) type plasma processing apparatus.

As illustrated in FIG. 1, the plasma processing apparatus 1 has a cylindrical process container 10 made of metal, for example, aluminum or stainless steel. The interior of the process container 10 is defined as a process chamber in which plasma processing such as plasma etching or plasma CVD (Chemical Vapor Deposition) is performed. The process container 10 defines a processing space for processing a substrate W (for example, a semiconductor wafer), which is an example of a substrate to be processed. The process container 10 is grounded.

A disk-shaped stage 11 is arranged inside the process container 10. The substrate W and an edge ring 33 are mounted on the stage 11. The stage 11 has an electrostatic chuck 25. The stage 11 is supported by a cylindrical support part 13 extending vertically upward from the bottom of the process container 10 via a cylindrical holding member 12 made of alumina ($Al_2O_3$).

The electrostatic chuck 25 has a mounting part 27 on which the substrate W and the edge ring 33 are mounted, and a base 28 made of aluminum. The mounting part 27 is made of a dielectric material such as ceramics, and has a first mounting part 27a on which the substrate W is mounted and a second mounting part 27b on which the edge ring 33 surrounding the peripheral edge of the substrate W is mounted. An attraction electrode 26, which is a conductive film, is embedded in the first mounting part 27a. A DC power source 29 is connected to the attraction electrode 26 via a switch 30. The electrostatic chuck 25 generates an electrostatic force such as a Coulomb force by a direct current (DC) voltage applied to the attraction electrode 26 from the DC power source 29, and attracts and holds the substrate W by the electrostatic force. The edge ring 33 is made of Si or SiC. An attraction electrode may also be provided in the second mounting part 27b to electrostatically attract the edge ring 33. The outer periphery of the electrostatic chuck 25 and the edge ring 33 is covered with an insulator ring 35.

A first high-frequency power source 21 is connected to the stage 11 via a matching device 21a. The first high-frequency power source 21 applies high-frequency power of a first frequency (for example, a frequency of 13 MHz) for plasma generation and RIE (Reactive Ion Etching) to the stage 11. In addition, a second high-frequency power source 22 is connected to the stage 11 via a matching device 22a. The second high-frequency power source 22 applies high-frequency power of a second frequency (for example, a frequency of 3 MHz) for bias application lower than the first frequency to the stage 11. Thus, the stage 11 also functions as a lower electrode.

A variable DC power source 31 is connected to a power supply line 21b via a switch 32. A blocking capacitor 23 is provided between a connection point between the variable DC power source 31 and the power supply line 21b, and the first high-frequency power source 21. The blocking capacitor 23 blocks the DC voltage from the variable DC power source 31 to prevent the DC voltage from flowing to the first high-frequency power source 21. A voltage is applied to the edge ring 33 by the DC voltage applied from the variable DC power source 31.

For example, an annular refrigerant chamber 34 extending in a circumferential direction is provided inside the base 28. A refrigerant having a predetermined temperature, for example, cooling water, is circulated and supplied from a chiller unit to the refrigerant chamber 34 via pipes 36 and 37 to cool the electrostatic chuck 25 and the substrate W.

Furthermore, a heat transfer gas supply part 38 is connected to the electrostatic chuck 25 via a gas supply line 39. The heat transfer gas supply part 38 supplies a heat transfer gas to a space between the upper surface of the electrostatic chuck 25 and the rear surface of the substrate W via the gas supply line 39. As the heat transfer gas, a gas having thermal conductivity, for example, a He gas or the like, is suitably used.

An exhaust passage 14 is formed between the sidewall of the process container 10 and the cylindrical support part 13. An annular baffle plate 15 is arranged at the inlet of the exhaust passage 14, and an exhaust port 16 is provided at the bottom thereof. An exhaust device 18 is connected to the exhaust port 16 via an exhaust pipe 17. The exhaust device 18 has a vacuum pump, which depressurizes the processing space in the process container 10 to a predetermined degree of vacuum. In addition, the exhaust pipe 17 has an automatic pressure control valve (hereinafter, referred to as an "APC") which is a variable butterfly valve, in which the APC automatically controls the internal pressure of the process container 1. Furthermore, a gate valve 20 for opening and closing a loading/unloading port 19 for the substrate W is provided on a sidewall of the process container 10.

A gas shower head 24 is arranged on a ceiling of the process container 10. The gas shower head 24 has an electrode plate 40, and an electrode support 41 that detachably supports the electrode plate 40. The electrode plate 40 has a plurality of gas vent holes 40a. A buffer chamber 42 is provided inside the electrode support 41, and a processing gas supply part 43 is connected to a gas introduction port 41a of the buffer chamber 42 via a gas supply pipe 44. Furthermore, a magnet 45 extending annularly or concentrically is arranged around the process container 10.

The respective components of the plasma processing apparatus 1 are connected to a controller 46. The controller 46 controls the respective components of the plasma processing apparatus 1. The respective components may include, for example, the exhaust device 18, the matching devices 21a and 22a, the first high-frequency power source 21, the second high-frequency power source 22, the switches 30 and 32, the DC power sources 29 and 31, the heat transfer gas supply part 38, the processing gas supply part 43, and the like.

The controller 46 includes a CPU 46a and a memory 46b, and reads a control program and a process recipe of the plasma processing apparatus 1 stored in the memory 46b and executes the same to cause the plasma processing apparatus 1 to execute predetermined processing such as etching or the like.

In the plasma processing apparatus 1, the gate valve 20 is first opened, and the substrate W is loaded into the process container 10 and is mounted on the electrostatic chuck 25, for example, during an etching process. The DC voltage from the DC power source 29 is applied to the attraction electrode 26 to attract the substrate W to the electrostatic chuck 25. Furthermore, the DC voltage from the variable DC power source 31 is applied to the base 28. Thus, a voltage is applied to the edge ring 33. In addition, the heat transfer gas is supplied to between the electrostatic chuck 25 and the substrate W. Then, the processing gas from the processing gas supply part 43 is introduced into the process container 10 and the interior of the process container 10 is depressurized by the exhaust device 18 or the like. Furthermore, the first high-frequency power and the second high-frequency power are supplied from the first high-frequency power source 21 and the second high-frequency power source 22 to the stage 11.

In the process container 10 of the plasma processing apparatus 1, a horizontal magnetic field is formed in one direction by the magnet 45, and a vertical RF electric field is formed by the high-frequency power applied to the stage 11. Thus, the processing gas discharged from the gas shower head 24 is plasmarized, and predetermined plasma processing is performed on the substrate W by radicals or ions in plasma.

[Configuration of Peripheral Portion of Stage 11]

Figure 2:
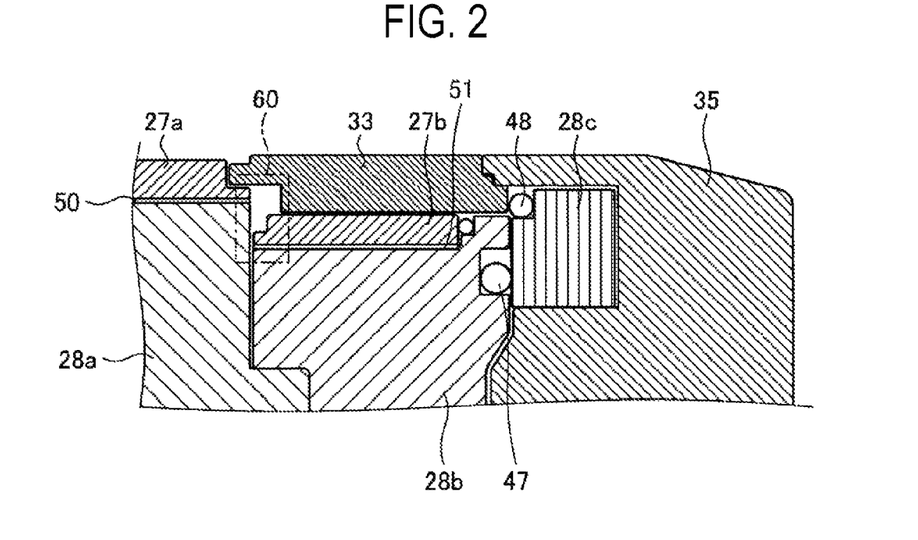
FIG. 2 is a partial enlarged view of the vicinity of an edge ring according to the present embodiment.

Next, a configuration of a peripheral portion of the stage 11 will be described with reference to FIGS. 2 and 3. FIG. 2 is a partial enlarged view of the vicinity of the edge ring according to the present embodiment. As illustrated in FIG. 2, the second mounting part 27b on which the edge ring 33 is mounted has a configuration one step lower than the first mounting part 27a on which the substrate W is mounted. The base 28 has a configuration in which it can be divided into a base 28a to which the first mounting part 27a is bonded by a first bonding layer 50, a base 28b to which the second mounting part 27b is bonded by a second bonding layer 51, and a base 28c that conducts the base 28b to the edge ring 33. The conduction is made between the base 28b and the base 28c and between the base 28c and the edge ring 33 via conductive members 47 and 48. The conductive members 47 and 48 are also referred to as conductance bands or spirals, and are conductive elastic members. The outer peripheral sides of the bases 28b and 28c and the edge ring 33 are covered with the insulator ring 35.

The first bonding layer 50 is exposed on the side surfaces of the first mounting part 27a and the base 28a. Furthermore, the second bonding layer 51 is exposed on the side surfaces of the second mounting part 27b and the base 28b because there is a gap between the base 28a and the base 28b. That is, the first bonding layer 50 and the second bonding layer 51 are exposed at different heights. The first bonding layer 50 and the second bonding layer 51 are, for example, epoxy-based or silicone-based bonding agents, and contain, for example, fillers such as silicon. As described above, in order to protect the first bonding layer 50 and the second bonding layer 51, the seal member is arranged in a region 60 which is a protection target portion in the present embodiment.

Figure 3:
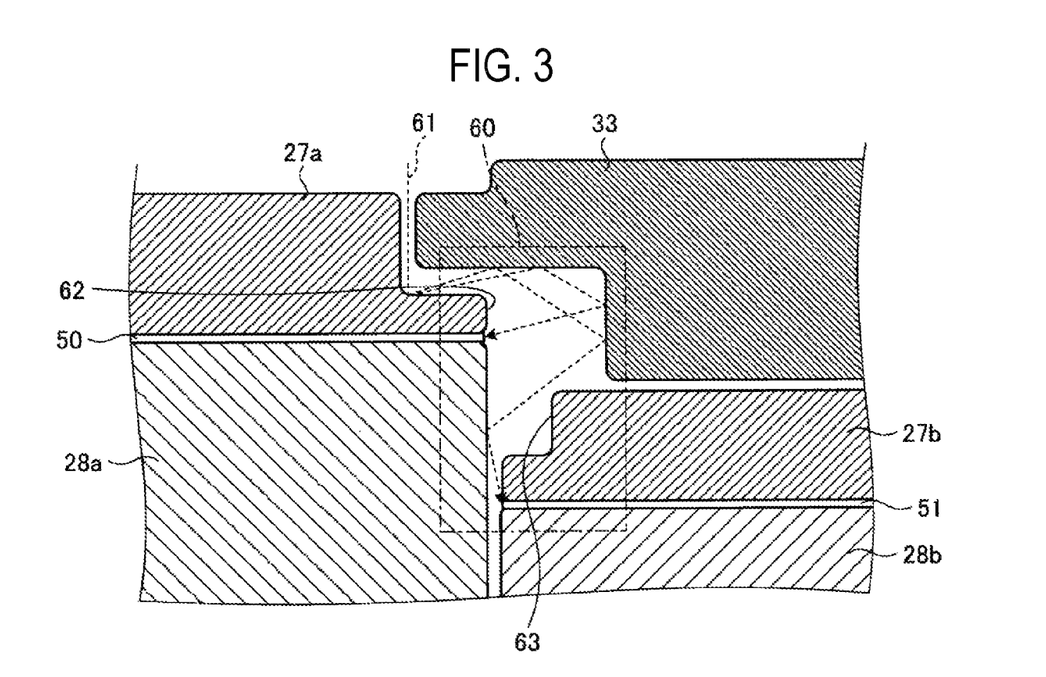
FIG. 3 is a partial enlarged view of a protection target portion according to the present embodiment.

FIG. 3 is a partial enlarged view of the protection target portion according to the present embodiment. As illustrated in FIG. 3, ions or radicals enter the region 60 as indicated by a path 61 during the plasma processing. In this case, if a seal member makes contact with a surface 62 of the first mounting part 27a and a surface 63 of the second mounting part 27b, the first bonding layer 50 and the second bonding layer 51 can be protected. On the other hand, in FIG. 3, gaps between the respective parts such as the first mounting part 27a and the edge ring 33, or the like are more largely depicted for the description of the path 61.

In the region 60, gaps between the first mounting part 27a, the second mounting part 27b, and the bases 28a and 28b differ from stage 11 to stage 11 due to tolerance of the parts. In addition, the gap between them may change by mismatch during installation and thermal expansion. Therefore, the seal member arranged in the region 60 is required to always make contact with the inner peripheral side surface 62 and the outer peripheral side surface 63 even when the gap changes.

[Configuration of Seal Member 70]

Figure 4:
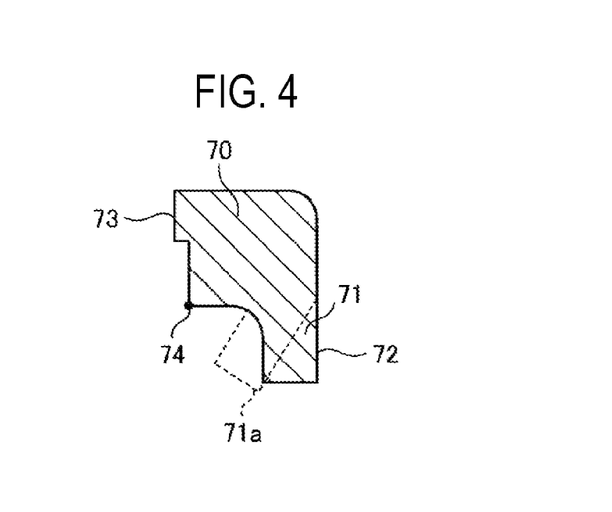
FIG. 4 is a cross-sectional view illustrating an example of a seal member according to the present embodiment.

FIG. 4 is a cross-sectional view illustrating an example of the seal member according to the present embodiment. A seal member 70 illustrated in FIG. 4 is a seal member mounted on the region 60 which is the protection target portion, in which a lower portion 71 is elastically deformed as indicated in a state 71a. For the seal member 70, for example, a perfluoro elastomer (FFKM) material having radical resistance may be used. Furthermore, the seal member 70 has, for example, a ring shape with elasticity and with a diameter slightly smaller than the outer circumference of the base 28a. The diameter of the seal member 70 may be equal to the outer periphery of the base 28a or may be slightly larger as long as it can serve to seal.

A surface 72 of the lower portion 71 makes contact with the surface 63 of the second mounting part 27b. A protruding portion 73 making contact with the surface 62 of the first mounting part 27a is formed in the upper portion of the seal member 70. Furthermore, when a support point 74 makes contact with the base 28a, and the seal member 70 is elastically deformed, it serves as a support point while the surface 72 and the protruding portion 73 are used as action points. In addition, the seal member 70 has a vertical dimension in a cross section larger than a horizontal dimension. By making the vertical dimension larger than the horizontal dimension, the seal member 70 can be easily provided in the protection target portion.

Figure 5:
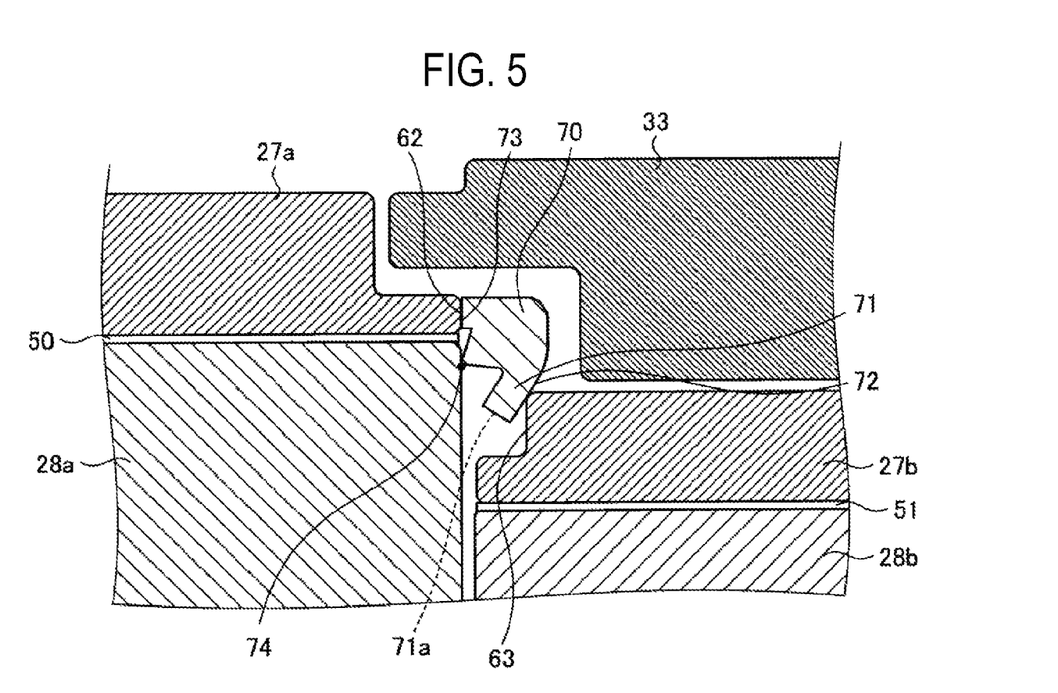
FIG. 5 is a view illustrating an example of a state in which the seal member of the present embodiment is provided in the protection target portion.

FIG. 5 is a diagram illustrating an example of a state in which the seal member of the present embodiment is provided in the protection target portion. As illustrated in FIG. 5, when provided in the region 60, the lower portion 71 of the seal member 70 is elastically deformed in the state 71a so that the surface 72 makes contact with the surface 63. Furthermore, the seal member 70 is elastically deformed so that the protruding portion 73 makes contact with the surface 62 and the support point 74 makes contact with the base 28a to become a support point. At this time, even if the gaps between the respective parts of the stage 11 change, the seal member 70 keeps the protruding portion 73 in contact with the inner peripheral side surface 62 and keeps the surface 72 in contact with the outer peripheral side surface 63 by a restoring force, making sure that the elastically deformed portion tries to return to its original state. That is, the seal member 70 performs the sealing action by a tightening force while the protruding portion 73 follows a variation or deviation of the first mounting part 27. Furthermore, the seal member 70 performs the sealing action by a restoring force of elastic deformation while the surface 72 follows a variation or deviation of the second mounting part 27b. Thus, in the stage 11, the first bonding layer 50 and the second bonding layer 51, which are the plurality of bonding layers having different heights, can be protected by one seal member 70.

[Exemplary Modification]

Figure 6:
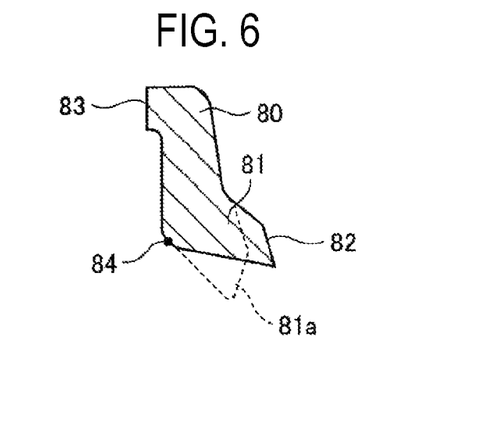
FIG. 6 is a cross-sectional view illustrating an example of a seal member according to an exemplary modification.

Next, a seal member having another shape in the region 60 will be described. FIG. 6 is a cross-sectional view illustrating an example of a seal member according to an exemplary modification. Similar to the seal member 70, a seal member 80 illustrated in FIG. 6 is a seal member mounted on the region 60 which is the protection target portion, in which a lower portion 81 is elastically deformed as indicated in a state 81a. As the seal member 80, for example, an FFKM material having radical resistance may be used like the seal member 70. Furthermore, the seal member 80 has, for example, a ring shape with elasticity and with a diameter slightly smaller than the outer circumference of the base 28a. The diameter of the seal member 80 may be equal to the outer circumference of the base 28a or may be slightly larger as long as it can serve to seal.

A surface 82 of the lower portion 81 makes contact with the surface 63 of the second mounting part 27b. A protruding portion 83 making contact with the surface 62 of the first mounting part 27a is formed in an upper portion of the seal member 80. Furthermore, when a support point 84 makes contact with the base 28a, and the seal member 80 is elastically deformed, it serves as a support point while the surface 82 and the protruding portion 83 are used as action points. In addition, the seal member 80 has a vertical dimension in a cross section larger than a horizontal dimension. By making the vertical dimension larger than the horizontal dimension, the seal member 80 can be easily provided in the protection target portion.

Figure 7:
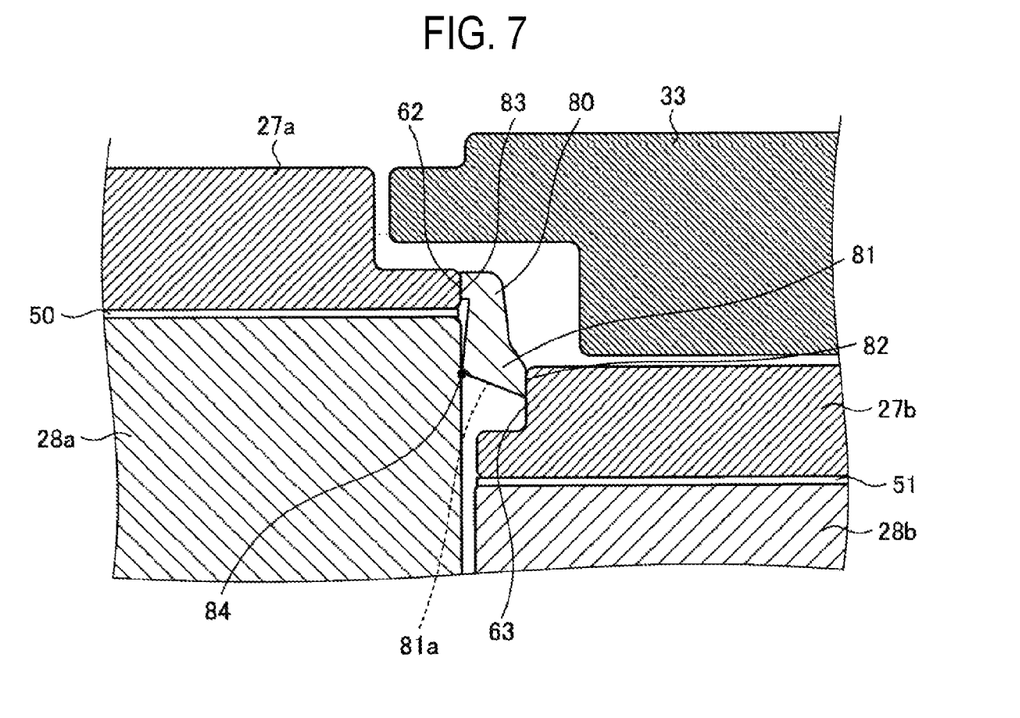
FIG. 7 is a view illustrating an example of a state in which the seal member of the exemplary modification is provided in the protection target portion.

FIG. 7 is a diagram illustrating an example of a state in which the seal member of the modification is provided in the protection target portion. As illustrated in FIG. 7, when the seal member 80 is provided by elastically deforming the lower portion 81 so as to be in the state 81a when it is provided in the region 60, the surface 82 makes contact with the surface 63. Furthermore, the seal member 80 is elastically deformed so that the protruding portion 83 makes contact with the surface 62 and the support point 84 makes contact with the base 28a to become a support point. At this time, even if the gaps between the respective parts of the stage 11 change, the seal member 80 keeps the protruding portion 83 in contact with the inner peripheral side surface 62 and keeps the surface 82 in contact with the outer peripheral side surface 63 by a restoring force making sure that the elastically deformed portion tries to return to the original state. That is, the seal member 80 performs the sealing action by a tightening force while the protruding portion 83 follows a variation or a deviation of the first mounting part 27a. Furthermore, the seal member 80 performs the sealing action by a restoring force of elastic deformation while the surface 82 follows a variation or a deviation of the second mounting part 27b. Thus, in the stage 11, the first bonding layer 50 and the second bonding layer 51, which are the plurality of bonding layers having different heights, can be protected by one seal member 80. In addition, since the seal members 70 and 80 are not pushed into a groove to be in a press-fit relationship like an O-ring, they can be easily attached and detached.

Furthermore, in the aforementioned embodiment, the seal members 70 and 80 are illustrated as ring-shaped members, but the present disclosure is not limited thereto. For example, they may be a plurality of arc-shaped members divided in the circumferential direction.

As described above, according to the present embodiment, the stage 11 has the first mounting part 27a, the second mounting part 27b, the first bonding layer 50, the second bonding layer 51, and the seal member 70. The substrate W is mounted on the first mounting part 27a. The second mounting part 27b is lower than the first mounting part 27a and the edge ring 33 surrounding the peripheral edge of the substrate W is mounted thereon. The first bonding layer 50 bonds the base 28a to the first mounting part 27a. The second bonding layer 51 bonds the base 28b to the second mounting part 27b. The seal member 70 is in contact with each of the first mounting part 27a and the second mounting part 27b above the first bonding layer 50 and the second bonding layer 51, to close a space between the first mounting part 27a and the second mounting part 27b by deformation. As a result, the plurality of bonding layers (the first bonding layer 50 and the second bonding layer 51) having different heights can be protected by one seal member 70. Furthermore, the seal member 70 can be easily attached to and detached from the stage 11.

In addition, according to the present embodiment, the lower portion 71 of the seal member 70 in contact with the second mounting part 27b is deformed. As a result, even if the gap between the respective parts of the stage 11 changes, the seal member 70 can keep the close contact state.

Furthermore, according to the present embodiment, the upper portion (protruding portion 73) of the seal member 70 in contact with the first mounting part 27a protrudes toward the first mounting part 27a. As a result, it can keep the close contact with the first mounting part 27a, which is the upper portion of the first bonding layer 50.

Moreover, according to the present embodiment, the seal member 70 has a vertical dimension in a cross section larger than a horizontal dimension. As a result, it can be easily attached to and detached from the stage 11.

The embodiment disclosed herein should be considered as illustrative in all respects and not restrictive. The aforementioned embodiment may be omitted, replaced or modified in various forms without departing from the sprit and scope of the accompanying claims.

Furthermore, the aforementioned embodiment described the plasma processing apparatus 1 that performs plasma processing on the substrate W using capacitively coupled plasma as a plasma source as an example, but the disclosed technique is not limited thereto. If the apparatus processes the substrate W using plasma, the plasma source is not limited to the capacitively coupled plasma but any plasma source such as inductively coupled plasma, microwave plasma, or magnetron plasma may be used.

According to the present disclosure in some embodiments, it is possible to protect a plurality of bonding layers having different heights by one seal member.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A stage, comprising:
a first mount having an upper surface on which a substrate is mounted;
a second mount on which an edge ring surrounding a peripheral edge of the substrate is mounted, the second mount located lower than the first mount;
a first bonding layer configured to bond a first base to the first mount;
a second bonding layer configured to bond a second base to the second mount; and
a sealer having elasticity and configured to close a space between the first mount and the second mount by deformation of the sealer above the first bonding layer and the second bonding layer while contacting with each of the first mount and the second mount,
wherein an upper end of the sealer is positioned lower than the upper surface of the first mount,
wherein the sealer has an inner peripheral surface including:
a protruding portion configured to contact with a surface of the first mount;
a first portion configured to be elastically deformed to make contact with a surface of the first base; and
a second portion located between the protruding portion and the first portion, and configured not to contact with the first mount and the first base, and
wherein an outer peripheral surface of the sealer is in contact with an upper portion of an inner peripheral surface of the second mount only in a region below the protruding portion and the first portion.

2. The stage of claim 1, wherein a lower portion of the sealer making ontact with the second mount is deformed.

3. The stage of claim 2, wherein the protruding portion is formed in an upper portion of the sealer and protrudes toward the first mount.

4. The stage of claim 3, wherein the sealer has a vertical dimension in a cross section larger than a horizontal dimension.

5. The stage of claim 1, wherein the protruding portion is formed in an upper portion of the sealer and protrudes toward the first mount.

6. The stage of claim 1, wherein the sealer has a vertical dimension in a cross section larger than a horizontal dimension.

7. The stage of claim 1, wherein a lower portion of the sealer makes contact with the second mount,
wherein the protruding portion is formed in an upper portion of the sealer, and
wherein, the first portion of the sealer includes a support point that makes contact with the first base when the sealer is elastically deformed.

8. The stage of claim 1,
wherein the first mount includes an outer peripheral portion including a top surface located lower than the upper surface, and
wherein the protruding portion is in contact with a side surface of the outer peripheral portion.

9. The stage of claim 1,
wherein the second mount includes an inner peripheral portion including a top surface located lower than a surface on which the edge ring is mounted, and
wherein the outer peripheral surface of the sealer is in contact with the inner peripheral surface of the second mount in a region above the inner peripheral portion.

10. The stage of claim 1, wherein the second portion is formed by being recessed inward from both of the protruding portion and the first portion.

11. The stage of claim 1,
wherein the sealer includes a lower portion positioned lower than the first portion, is configured to be in contact with a surface of the second mount, and is configured not to be in contact with the first base, and
wherein the first portion comes in contact with the surface of the first base as the lower portion deforms by coming in contact with the second mount.

12. A plasma processing apparatus comprising:
a stage comprising:
a first mount having an upper surface on which a substrate is mounted;
a second mount on which an edge ring surrounding a peripheral edge of the substrate is mounted, the second mount located lower than the first mount;
a first bonding layer configured to bond a first base to the first mount;
a second bonding layer configured to bond a second base to the second mount; and
a sealer having elasticity and configured to close a space between the first mount and the second mount by deformation of the sealer above the first bonding layer and the second bonding layer while contacting with each of the first mount and the second mount,
wherein an upper end of the sealer is positioned lower than the upper surface of the first mount,
wherein the sealer has an inner peripheral surface including:
a protruding portion configured to contact with a surface of the first mount;
a first portion configured to be elastically deformed to make contact with a surface of the first base; and
a second portion located between the protruding portion and the first portion, and configured not to contact with the first mount and the first base, and
wherein an outer peripheral surface of the sealer is in contact with an upper portion of an inner peripheral surface of the second mount only in a region below the protruding portion and the first portion.

13. The plasma processing apparatus of claim 12,
wherein a lower portion of the sealer makes contact with the second mount,
wherein the protruding portion is formed in an upper portion of the sealer, and
wherein, the first portion of the sealer includes a support point that makes contact with the first base when the sealer is elastically deformed.

* * * * *